US006230245B1

(12) United States Patent
Manning

(10) Patent No.: US 6,230,245 B1
(45) Date of Patent: May 8, 2001

(54) METHOD AND APPARATUS FOR GENERATING A VARIABLE SEQUENCE OF MEMORY DEVICE COMMAND SIGNALS

(75) Inventor: Troy A. Manning, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 08/798,229

(22) Filed: Feb. 11, 1997

(51) Int. Cl.$^7$ .................................................. G06F 12/00

(52) U.S. Cl. ............... 711/167; 365/230.05; 365/230.01; 711/154; 711/105

(58) Field of Search ............................... 365/233, 230.06, 365/230.01; 371/27.6; 377/56; 711/104, 105, 154, 167

(56) References Cited

U.S. PATENT DOCUMENTS

| | | | |
|---|---|---|---|
| 4,312,068 | 1/1982 | Goss et al. ............................. | 371/37 |
| 4,695,952 | 9/1987 | Howland ............................... | 364/200 |
| 4,768,190 | 8/1988 | Giancarlo ............................. | 370/86 |
| 4,845,664 | 7/1989 | Aichelmann, Jr. et al. ......... | 364/900 |
| 4,849,702 | 7/1989 | West et al. ........................... | 328/63 |
| 4,943,946 | 7/1990 | Brent ................................. | 365/189.12 |
| 5,099,481 | 3/1992 | Miller ................................ | 371/22.1 |
| 5,175,732 | 12/1992 | Hendel et al. ..................... | 370/94.1 |
| 5,235,595 | 8/1993 | O'Dowd ............................. | 370/94.1 |
| 5,297,029 | 3/1994 | Nakai et al. ...................... | 365/238.5 |
| 5,321,700 | * 6/1994 | Brown et al. ..................... | 371/27.6 |
| 5,325,493 | 6/1994 | Herrell et al. .................... | 395/375 |
| 5,337,410 | 8/1994 | Appel ................................. | 395/162 |
| 5,355,345 | * 10/1994 | Dickinson et al. ............... | 365/230.01 |
| 5,367,643 | 11/1994 | Chang et al. ..................... | 395/325 |
| 5,390,224 | * 2/1995 | Komarsuda ...................... | 377/56 |

(List continued on next page.)

FOREIGN PATENT DOCUMENTS

| | | |
|---|---|---|
| 59116829 | 7/1984 | (EP) . |
| 0 468 480 A2 | 5/1992 | (EP) . |
| 0 486 480 A2 | 5/1992 | (EP) .............................. B01D/21/26 |
| 0 605 887 A2 | 7/1994 | (EP) ................................ G11C/7/00 |
| 2 128 383 | 4/1984 | (GB) . |
| 09161475 | 6/1997 | (JP) . |
| WO 96/24935 | 8/1996 | (WO) ............................. G11C/16/06 |

OTHER PUBLICATIONS

Descriptive literature entitled, "400 MHz SLDRAM, 4M×16 SLDRAM Pipelined, Eight Bank, 2.5 V Operation," pp. 1–22.

"Draft Standard for a High–Speed Memory Interface (SyncLink)," Microprocessor and Microcomputer Standards Subcommittee of the IEEE Computer Society, Copyright 1996 by the Institute of Electrical and Electronics Engineers, Inc., New York, NY, pp. 1–56.

(List continued on next page.)

Primary Examiner—John W. Cabeca
Assistant Examiner—Pierre-Michel Bataille
(74) Attorney, Agent, or Firm—Dorsey & Whitney LLP

(57) ABSTRACT

A command generator for a dynamic random access memory decrements a counter from an initial counter value which is a function of the clock speed. The output of the counter is decoded to generate various command signals for the DRAM. In particular, each command signal is generated by a respective counter value, with the correspondency between counter values and command signals being a function of the clock speed. The counter decrements from larger initial values at higher clock speeds, and the command signals are generally issued by the decoder at higher counter values for higher clock speeds. As a result of the lack of correspondency between the timing of the command signals and the number of clock cycles occurring during a memory access, the timing of the command signals may be selected to optimize the speed of the DRAM desired despite substantial variations in clock speed.

60 Claims, 11 Drawing Sheets

U.S. PATENT DOCUMENTS

| | | | |
|---|---|---|---|
| 5,402,390 | 3/1995 | Ho et al. | 365/225.7 |
| 5,454,093 | 9/1995 | Abdulhafiz et al. | 395/460 |
| 5,471,430 | 11/1995 | Sawada et al. | 365/222 |
| 5,553,010 | 9/1996 | Tanihira et al. | 364/715.08 |
| 5,557,763 | 9/1996 | Senter et al. | 395/375 |
| 5,566,325 | 10/1996 | Bruce, II et al. | 395/494 |
| 5,581,512 * | 12/1996 | Kiramura | 365/233 |
| 5,600,605 | 2/1997 | Schaefer | 365/233 |
| 5,615,355 | 3/1997 | Wagner | 395/494 |
| 5,636,174 | 6/1997 | Rao | 365/230.03 |
| 5,640,354 | 6/1997 | Jang et al. | 365/201 |
| 5,652,733 * | 7/1997 | Chen et al. | 365/233 |
| 5,701,434 | 12/1997 | Nakagawa | 395/484 |
| 5,713,005 | 1/1998 | Proebsting | 395/496 |
| 5,732,041 | 3/1998 | Joffe | 365/230.08 |
| 5,737,563 | 4/1998 | Shigeeda | 365/230.08 |
| 5,751,656 * | 5/1998 | Schaefer | 365/233.5 |
| 5,764,584 | 6/1998 | Fukiage et al. | 365/230.03 |
| 5,778,419 | 7/1998 | Hansen et al. | 711/112 |
| 5,793,688 | 8/1998 | McLaury | 365/203 |
| 5,793,996 | 8/1998 | Childers et al. | 710/129 |
| 5,812,074 | 9/1998 | Chung | 341/67 |
| 5,813,023 * | 9/1998 | McLaury | 711/105 |
| 5,825,711 | 10/1998 | Manning | 365/230.03 |
| 5,831,929 | 11/1998 | Manning | 365/233 |
| 5,835,925 | 11/1998 | Kessler et al. | 711/2 |
| 5,838,990 * | 11/1998 | Park et al. | 710/14 |
| 5,848,431 | 12/1998 | Pawlowski | 711/5 |
| 5,860,080 | 1/1999 | James et al. | 711/4 |
| 5,887,146 | 3/1999 | Baxter et al. | 395/284 |
| 5,907,860 | 5/1999 | Garibay, Jr. et al. | 711/117 |
| 5,920,510 | 7/1999 | Yukutake et al. | 365/189.05 |
| 5,920,710 | 7/1999 | Tan et al. | 395/392 |
| 5,946,260 | 8/1999 | Manning | 365/230.03 |
| 5,954,804 | 9/1999 | Farmwald et al. | 710/36 |
| 5,996,043 | 11/1999 | Manning | 711/105 |
| 6,032,220 | 2/2000 | Martin et al. | 711/5 |
| 6,032,232 | 2/2000 | Lindeborg et al. | 711/149 |
| 6,055,615 | 4/2000 | Okajima | 711/169 |
| 6,101,136 * | 8/2000 | Mochida | 365/194 |

OTHER PUBLICATIONS

Gillingham, P., "SLDRAM Architectural and Functional Overview," SLDRAM Consortium, Aug. 29, 1997, pp. 1–14.

"Increasing Data Read Rate From Memories", IBM Technical Disclosure Bulletin, vol. 30, No. 12, May 1988, pp. 339–341.

Prince, Betty, "High Performance Memories", John Wiley & Sons Ltd., West Sussex, England, 1996, pp. 143–146.

* cited by examiner

| CNT | 800 MHz | 400 MHz |
|---|---|---|
| 255 | * | |
| 240 | Latch Row Address | |
| 224 | | |
| 208 | Decode Row | |
| 192 | | |
| 176 | Precharge Row | |
| 160 | | |
| 144 | Decode Col. Address | * Latch Row Address |
| 128 | | |
| 112 | Enable Sense Amps | Decode Row |
| 96 | | |
| 80 | | Precharge Row |
| 64 | Enable Row | Decode Col. Address |
| 48 | | Enable Sense Amps |
| 32 | Connect Data Path | Enable Row |
| 16 | | Connect Data Path |
| 0 | | |

Fig. 2

METHOD AND APPARATUS FOR GENERATING A VARIABLE SEQUENCE OF MEMORY DEVICE COMMAND SIGNALS

TECHNICAL FIELD

This invention relates to command signal generators for memory devices, and more particularly, to a command signal generator that generates a sequence of memory device commands that may vary as a function of clock speed.

BACKGROUND OF THE INVENTION

In the operation of a dynamic random access memories ("DRAMs"), specific functions must occur in a predetermined sequence. These functions are generally performed responsive to respective command signals issued by a command generator. The timing of the command signals is generally controlled by a clock signal either registered to an edge of the clock signal or occurring a predetermined time after an edge of the clock signal. The rate at which the DRAM may process commands is limited by the amount of time it takes to perform functions responsive to the commands. For most functions, the minimum times to perform the functions are specified by the manufacturer of the DRAM. however, since the commands are generally issued responsive to clock signals, the amount of time that the DRAM has to perform its functions is controlled by the clock speed. For example, as illustrated in FIG. 1A, a memory read command 10 is issued by a conventional memory controller and is registered with a clock signal 12 at time $t_0$. As further shown in FIG. 1A, it requires four clock cycles to complete the read operation because of the many operations that must occur in a DRAM before data can be read from the DRAM. Thus, a data bit 14 is not present on the data bus until time $t_1$. The elapsed time from issuing the read command 10 to the complete processing of the command by applying the data bit 14 to the data bus is therefore $\Delta t_a$. The elapsed time could be reduced by increasing the speed of the clock 12. However, regardless of the speed of the clock, the DRAM requires a certain minimum time to complete its functions. Speeding the clock up beyond that point will not reduce the amount of time required to perform those functions.

Although DRAMs are operating at optimum speed when the clock is at or near its maximum speed, they operate a far from optimum speed responsive to slower clock speeds. With reference to FIG. 1B, a clock signal 20 has a speed or frequency only half that of the clock 12 in FIG. 1A. Once again, a read command 22 is registered with the clock 20 at time $t_0$, and a data bit 24 is applied to the data bus four clock cycles later. However, because of the slower speed clock 20, the data bit 24 is not applied to the data bus until $t_2$. As a result of the slower clock speed, the elapsed time between issuing of the read command 22 and complete processing of the command is $\Delta t_b$, which is twice the duration of $\Delta t_a$. Thus, by employing a fixed relationship between a clock signal and the issuing of command signals, conventional DRAMs often operate at far from optimum speed when they receive a relatively slow clock signal.

It will be understood by one skilled in the art that the timing diagrams of FIGS. 1A and 1B omit a large number of other signals applied to the DRAM. These signals have been omitted for purposes of brevity. Also, one skilled in the art will understand that the command signals 10, 22 are, in reality, composed of a combination of other signals which are commonly referred to as simply a command. The exact nature of these signals will depend on the nature of the DRAM, but the principle explained above is applicable to all type of DRAMs, including asynchronous DRAMs, synchronous DRAMs, and packetized DRAMs. Also, although the problem resulting from issuing command signals according to a fixed relationship with the clock signal has been explained with reference to DRAMs, the explanation of the problem as well as the solution provided by the preferred embodiment of the invention are applicable to other integrated circuits that issue command signals or the like responsive to a clock signal.

SUMMARY OF THE INVENTION

A command generator for generating command signals for a memory device includes a sequencer generating a sequence of command signals responsive to a clock signal that may have one of a plurality of clock speeds. Each of the sequences of command signals preferably corresponds to a respective clock speed, and the sequencer selects one of the sequences as a function of the clock speed. The sequencer may include a counter and a decoder. The counter receives the clock signal and provides a counter value that increments or decrements responsive to the clock signal. The decoder generates one of a plurality of sequences of command signals, with the command signals in each sequence corresponding to respective counter values. Each of the sequences of command signals corresponds to a respective clock speed, and the decoder selects one of the sequences as a function of the clock speed. Thus, the correspondency between each command signal and its respective counter value is a function of the clock speed. The command generator may also include a counter load circuit coupled to the counter. The counter load circuit loads an initial count into the counter that is a function of the clock speed. The counter then increments or decrements from the initial value responsive to the clock signal. The command generator may also include a counter enable circuit generating a counter enable signal to permit the counter to increment or decrement responsive to the clock signal. The counter enable circuit MAY include a latch circuit and a counter start circuit. The latch circuit generates the counter enable signal responsive to a start signal and terminates the counter enable signal responsive to a stop signal. The counter start circuit generates the start signal and includes a clock detector detecting predetermined portions of the clock signal, and a variable delay enable circuit coupled to the clock detector. The variable delay enable circuit generates the start signal responsive to one of the detected predetermined portions of the clock signal after a predetermined number of cycles of the clock signal have elapsed from receiving a flag signal. The command generator may be used in any type of dynamic random access memory or other circuit which may be part of a computer system.

BRIEF DESCRIPTION OF THE DRAWINGS

FIG. 2 is a chart illustrating a basic concept of the preferred embodiment of the invention.

DETAILED DESCRIPTION OF THE INVENTION

Figure 1A:
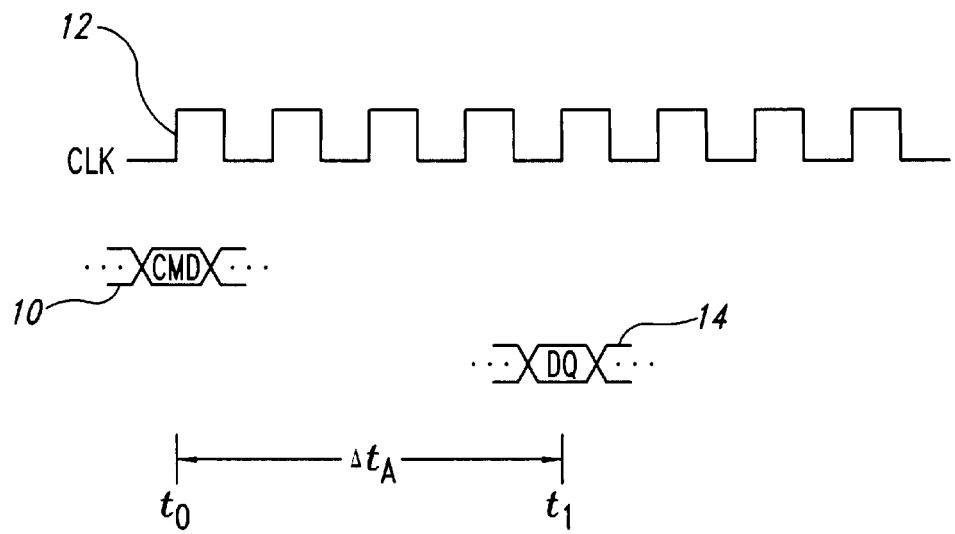
FIGS. 1A and 1B are timing diagrams illustrating the relationship between clock signals and the processing of commands in a conventional dynamic random access memory.
Figure 1B:
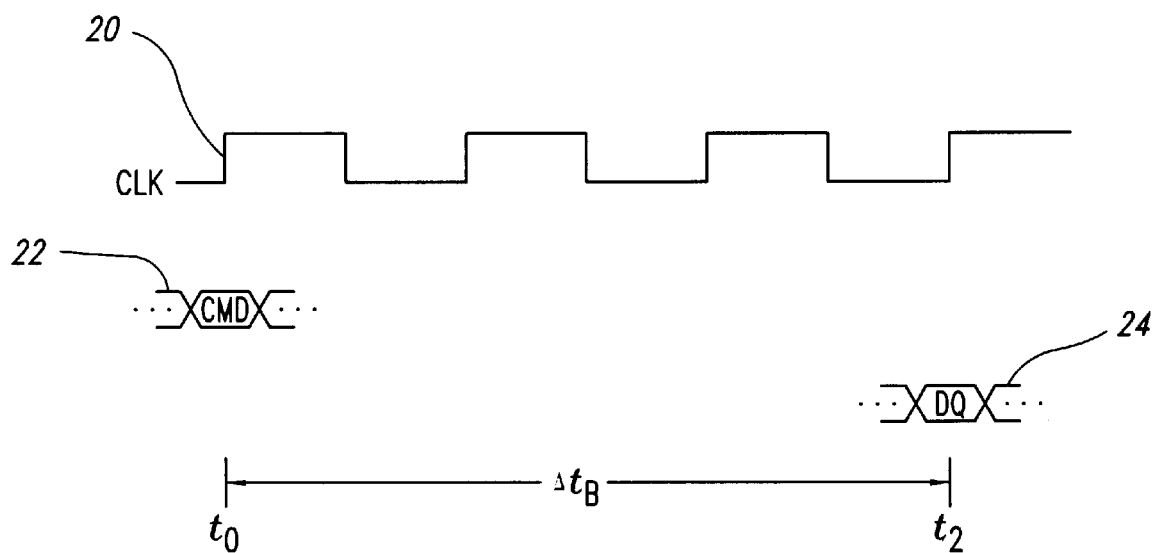

Before describing the preferred embodiment of the invention, the theory of operation of the preferred embodiment will be explained with reference to FIG. 2. FIG. 2 is a diagram representing the status of a counter and decoder (described below) in which the counter decrements responsive to a clock signal from an initial value to 0. The maximum initial value of the counter is 255. At various counter values, the decoder issues respective DRAM read command signals, some of which are shown in FIG. 2. Listed in the left-hand side of the diagram opposite their respective counter values are the command signals issued by the decoder when the frequency of the clock signal is 800 MHz. Listed in the right-hand side of the diagram in FIG. 2 opposite their respective counter values are those same command signals as they occur when the frequency of the clock signal is 400 MHz.

As shown in FIG. 2, when the clock frequency is 800 MHz, the counter begins decrementing from 255 (designated by the asterisk). An external row address is then latched at about count 240, the row address is decoded at about count 208, the row is precharged and equilibrated at about count 170, an externally applied column address is decoded at about count 135, the sense amps corresponding to the decoded column address are enabled at count 112, the addressed row is enabled at about count 65, and the data path connects the digit lines of the enabled sense amplifier to an external data bus terminal at about count 30.

As further shown in FIG. 2, these same read commands are also issued by the decoder when the clock speed is 400 MHz, except that they are issued at substantially lower count values and the counter begins decrementing from about 150. The external row address is then latched at about count 135, the row address is decoded at about count 120, the row is precharged and equilibrated at about count 96, an externally applied column address is decoded at about count 70, the sense amps for the column address are enabled at about count 50, the addressed row is enabled at about count 32, and the data path couples data from the digit lines of the enabled sense amplifier to the external data bus terminal at about count 10. Note that, even though the command signals listed on the right-hand side of FIG. 2 are issued at substantially later count values, they occur at substantially the same time from the start of a memory access. Although approximately twice as many clock pulses may occur between the command signals when the clock frequency is 800 MHz as compared to 400 MHz, the command signals are nevertheless issued at the same times because of the higher clock speed. However, it should be emphasized that the timing of the command signals may not be entirely linear. For example, a command signal that may be issued at counter value 40 for a 400 MHz clock signal may not be issued at counter value 80 for an 800 MHz clock signal. However, a given command signal will normally be issued at a higher counter value for a higher clock frequency. By eliminating a fixed relationship between the number of clock cycles and the issuing of command signals, the command generator is able to issue command signals at an optimum rate for a wide variety of clock speeds.

Figure 3:
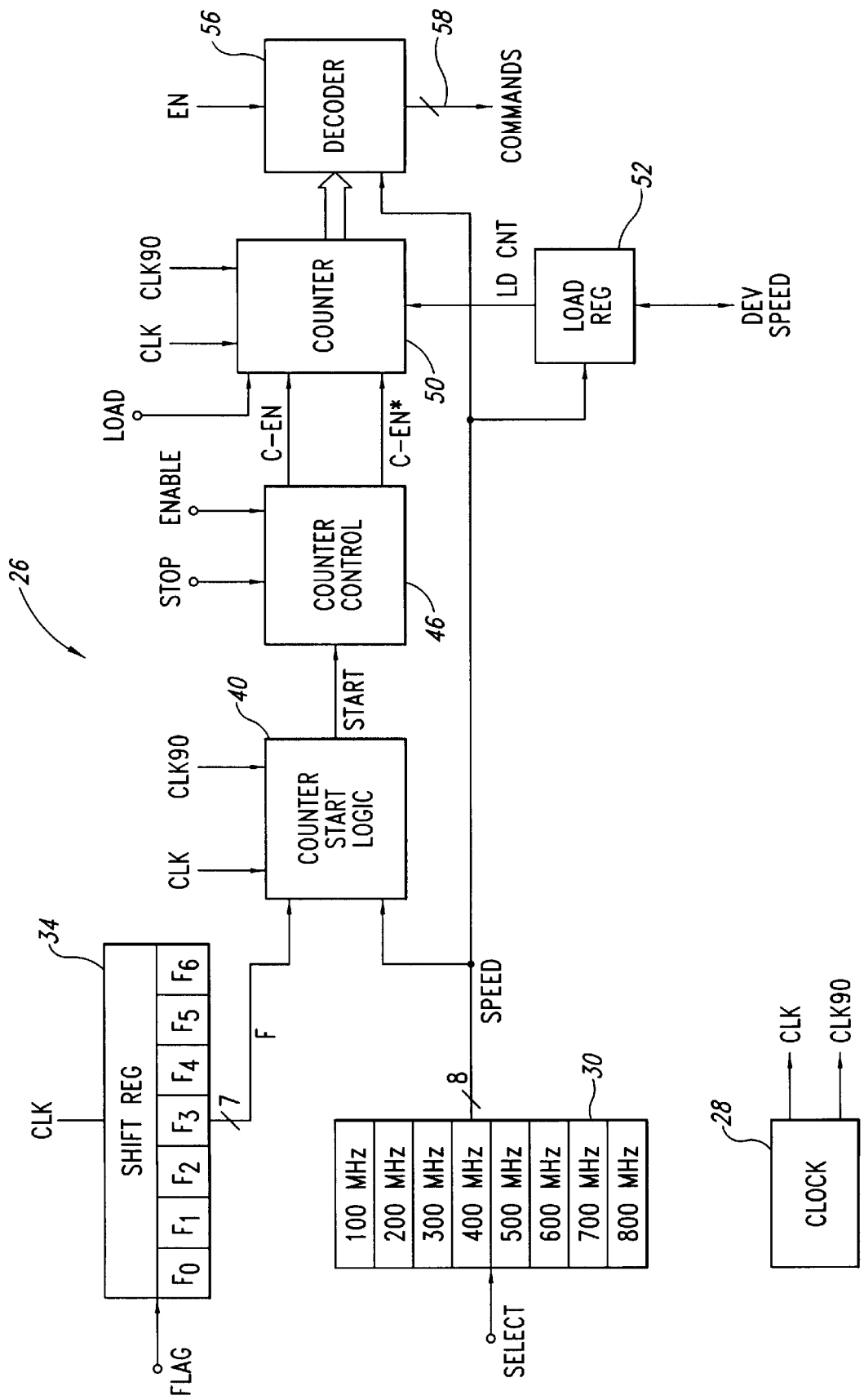
FIG. 3 is a block diagram of a preferred embodiment of the invention.

A block diagram of a preferred embodiment of a Command Generator 26 according to the invention is illustrated in FIG. 3. The operation of much of the Command Generator 26 illustrated in FIG. 3 is controlled by a clock signal CLK and a quadrature clock signal CLK 90 generated by a conventional clock circuit 28. A register 30 includes a plurality of storage cells corresponding in number to the number of possible different clock speeds. One of these plurality of clock speeds is designated by a SELECT signal. The SELECT signal may be generated by user action, by software, or by another circuit. Alternatively, a register designating the clock speed using other data formats, such as binary, may be used. However, in the register 300 illustrated in FIG. 3, one and only one of the storage cells will contain a logic "1" to designate the corresponding clock speed as the speed of the clock signals output from the clock circuit 28. The output of the register 30 is applied to a number of circuits, as explained in greater detail below.

Figure 4:
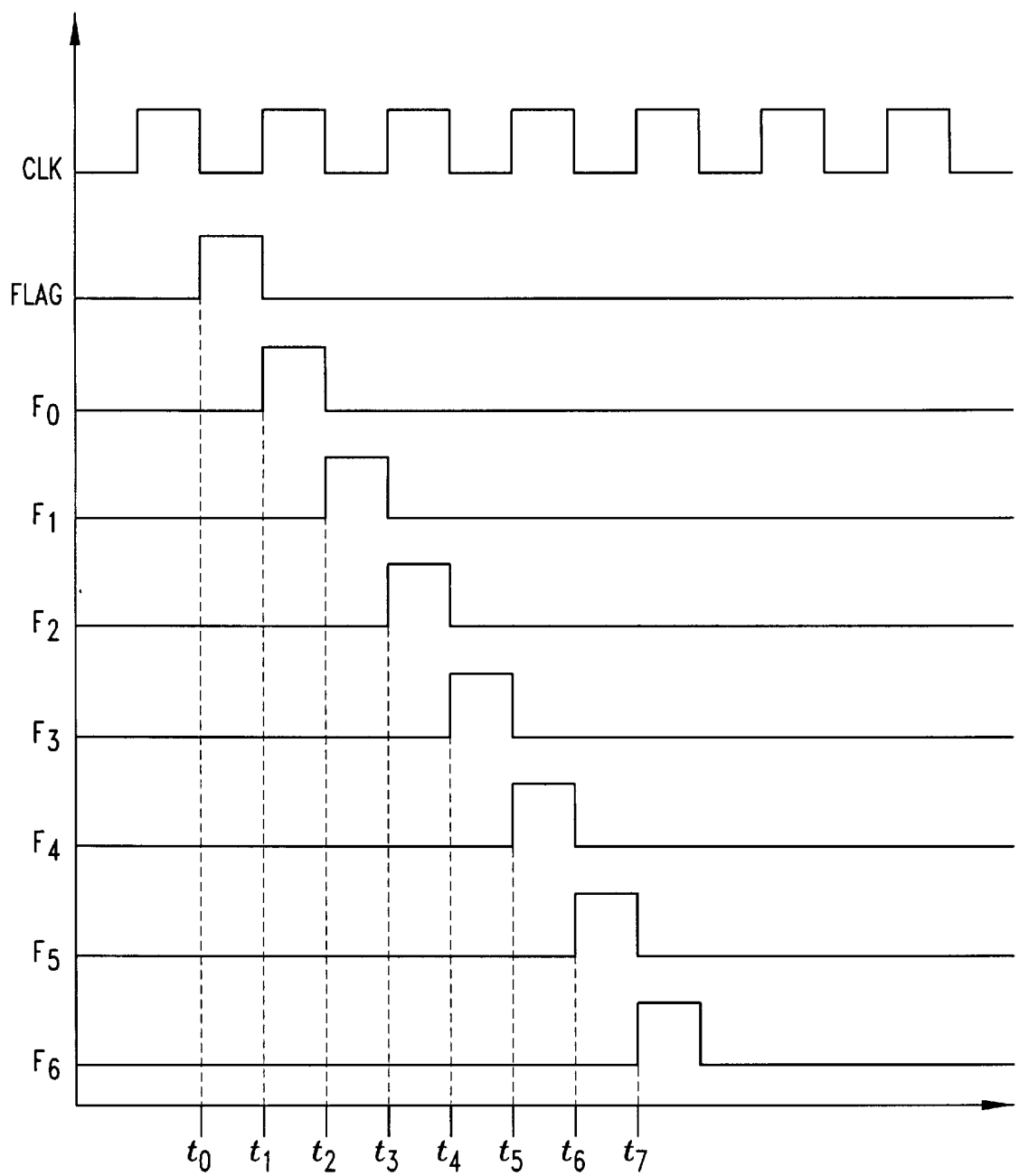
FIG. 4 is a timing diagram illustrating the relationship between various signals present in the preferred embodiment of FIG. 3.

A sequence of command signals is initiated by a positive going FLAG signal applied to a shift register 34 containing seven shift stages designated $F_0$–$F_6$. The operation of the shift register 34 is best explained with reference to the timing diagram of FIG. 4. As shown in FIG. 4, the shift register 34 receives the clock signal CLK from the clock circuit 28 as well as a positive going FLAG signal at time $t_0$. The FLAG signal is shifted into the first stage of the shift register 34 by the rising CLK edge at time $t_1$, it is shifted into the second stage of the shift register 34 by the next CLK edge at time $t_2$. Thereafter, the high FLAG signal is successively shifted through each of the remaining stages $F_1$–$F_6$ by each CLK edge transition (both negative going and positive going). For example, the $F_2$ pulse occurs at time $t_3$, and the $F_4$ pulse occurs at time $t_5$, etc. Thus, the delay from the receipt of the FLAG signal to shifting the FLAG signal into each shift stage $F_0$–$F_6$ incrementally increases with each successive F value. As explained below, the pulses from the later shift stages, e.g., $F_6$, are used to initiate a sequence of command signals at higher clock speeds while a pulse from a lower shift stage (e.g., $F_4$) is used to initiate a sequence of command signals at lower clock speeds. However, since the clock speed is higher when the $F_6$ pulse is used to initiate the sequence, the time between the FLAG signal and the F signal initiating the sequence of command signals varies to a lesser extent.

Returning, now, to FIG. 3, the F signal at the output of the shift register 34 is applied to a Counter Start Logic circuit 40 along with the SPEED signal indicative of the clock speed. As explained in detail below, the Counter Start Logic circuit 40 generates a START signal responsive to the F signal registered to either the rising or falling edge of the clock signal CLK. As mentioned above, the Counter Logic Circuit 40 uses a more delayed F signal for higher clock speeds. As a result, the Counter Start Logic circuit 40 generates the START signal after a variable number of clock cycles from the FLAG signal. The number of clock cycles is larger for higher clock speeds and lower for lower clock speeds.

The START signal from the Counter Start Logic circuit 40 is applied to a Counter Control circuit 46 which also receives a STOP signal and an ENABLE signal from circuitry elsewhere in the integrated circuit (not shown). The Counter Control circuit 46 generates complementary C-EN and C-EN* signals to selectively enable a Counter 50. Basically, as long as the ENABLE input to the Counter Control circuit 46 is high, the Counter 50 is enabled responsive to the START signal and disabled responsive to the STOP signal.

As explained above with reference to FIG. 2, the Counter 50 is an 8 stage quadrature counter which decrements from 255 to 0 responsive to the clock signals, CLK and clock CLK 90. However, the Counter 50 may have a larger or smaller number of stages, and it may be other than a conventional counter using quadrature clock signals. An initial counter value LD CNT is loaded into the Counter 50 from a Load Register 52 responsive to a LOAD signal which is applied from other circuitry in the integrated circuit (not shown). The LD CNT value loaded into the Counter 50 is determined by the speed signal SPEED and a Device Speed value applied from other circuitry in the integrated circuit (not shown). Basically, the Load Register 52 stores respective initial counter values for the eight possible clock speeds designated by the register 30 and, for each of these eight possible clock speeds, a variety of initial counter values depending upon the maximum device operating speed. Thus, in the example explained above with reference to FIG. 2, the LD CNT value for an 800 MHz clock speed is 240 and the LDCNT value for a 400 MHz clock speed is about 150. However, for an 800 MHz clock speed, the initial counter value might be 200, 220, 240, 260, or 280 depending upon the maximum operating speed of the integrated circuit as designated by the Device Speed value. The 280 initial counter value would be used for a slower integrated circuit to provide more time to issue the sequence of command signals which the 200 initial counter value would be used for a faster integrated circuit which was capable of issuing the sequence of command signals in a shorter time. After the initial counter value is loaded into the Counter 50, the Counter 50 decrements responsive to the CLK and CLK 90 signals from the clock circuit 28.

The 8-bit binary count value output by the Counter 50 is applied to a Decoder 56 which generates command signals on a plurality of lines 58 corresponding to various counter values. As explained above with reference to FIG. 2, the command signal corresponding to each counter value is a function of the clock speed. Therefore, the Decoder 56 also receives the SPEED signal from the register 30 so it can generate the proper command signals 58 from each counter value output by the Counter 50.

Figure 5:
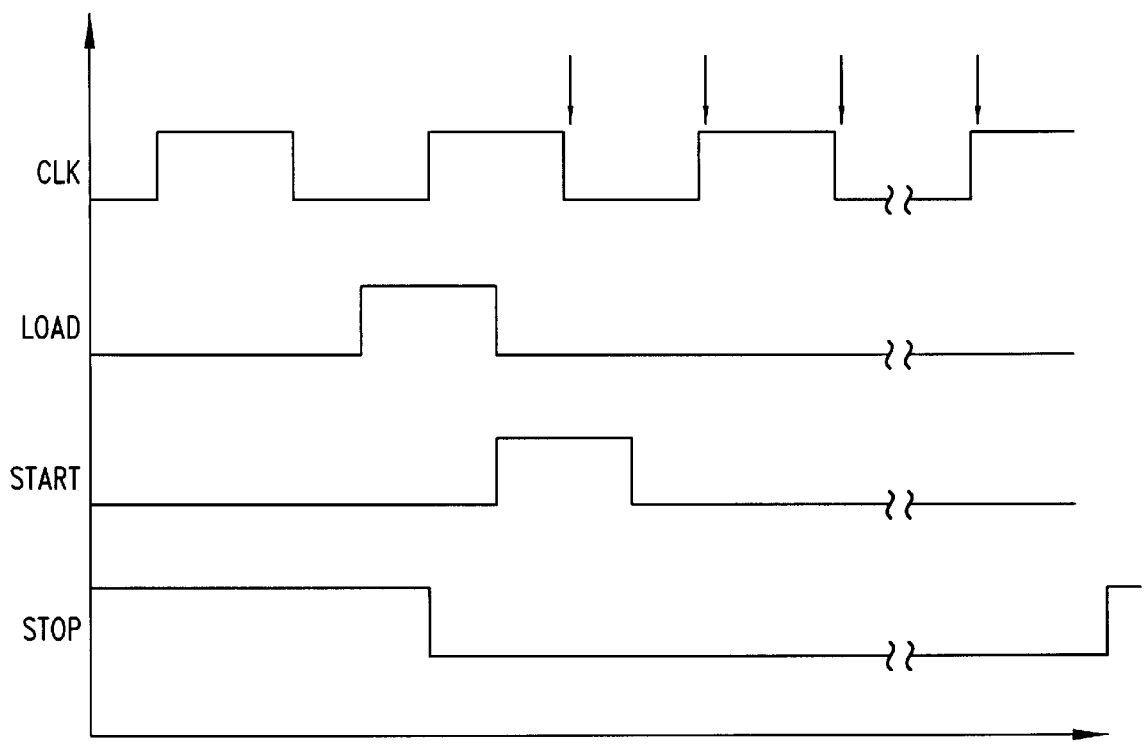
FIG. 5 is a timing diagram illustrating signals applied to and output from the shift register used in the preferred embodiment of FIG. 3.

The operation of the Command Generator 26 illustrated in FIG. 3 is best explained with reference to the timing diagram of FIG. 5. The speed signal SPEED corresponding to the clock speed is output to the Counter Start Logic circuit 40 and the Decoder 56, as explained above. When the FLAG signal is received by the shift register 34, the shift register 34 generates a sequence of F signals, one of which is used by the Counter Start Logic circuit 40 to generate the START signal. However, as illustrated in FIG. 5, prior to the START signal, a LOAD signal loads the initial counter value LD CNT from the Load Register 52, and the STOP signal goes inactive low. In response to the positive going START signal illustrated in FIG. 5, the Counter Control circuit 46 enables the Counter 50 so that it decrements from the initial counter value. The Decoder 56 then generates appropriate command signals responsive to the counter values and the SPEED signal. At or before the terminal count, other circuitry in the integrated circuit causes the STOP signal to go active high, thereby causing the Counter Control circuit 46 to disable the Counter 50.

Figure 6:
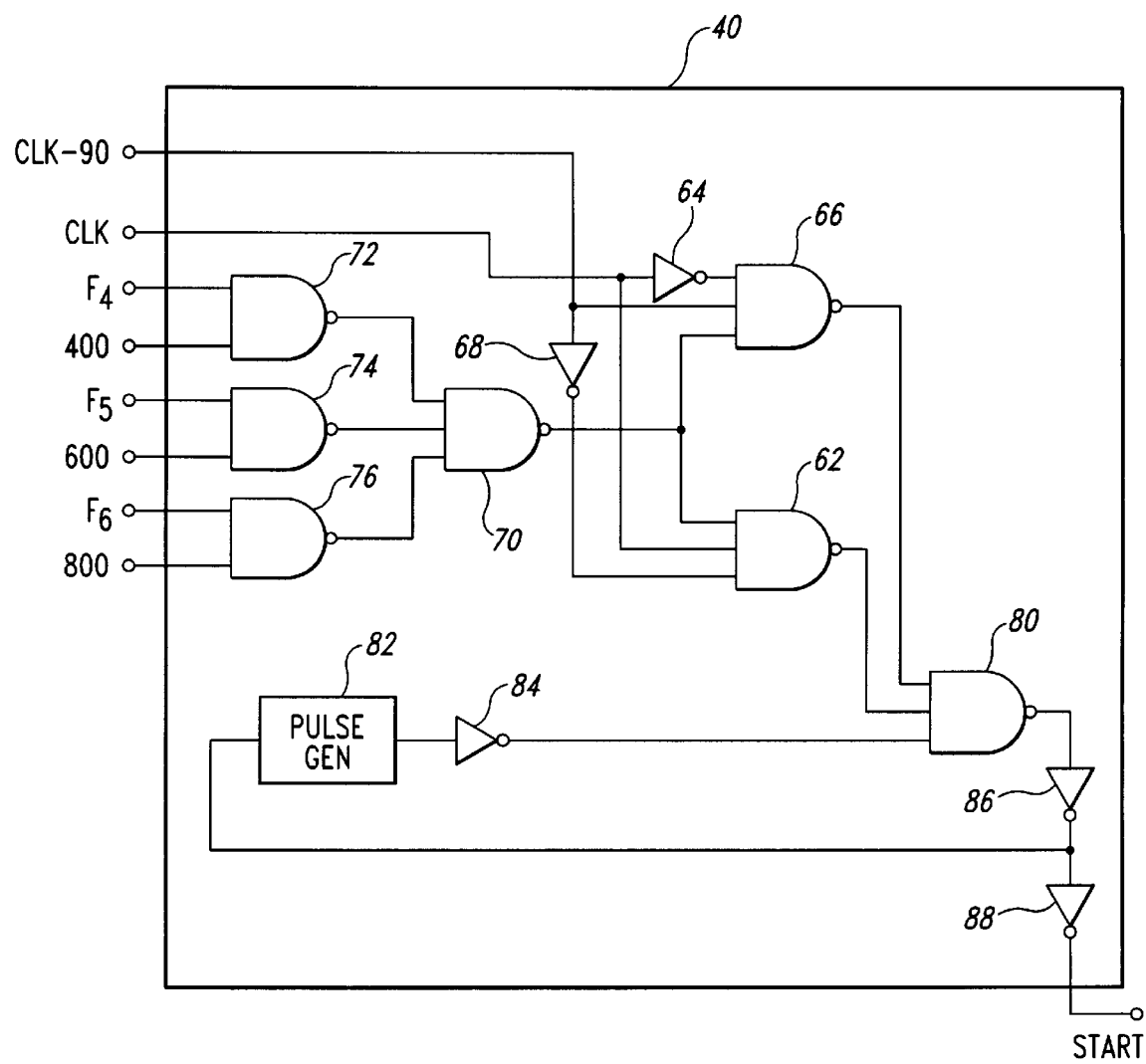
FIG. 6 is a logic diagram of a counter start logic used in the preferred embodiment of FIG. 3.
Figure 7:
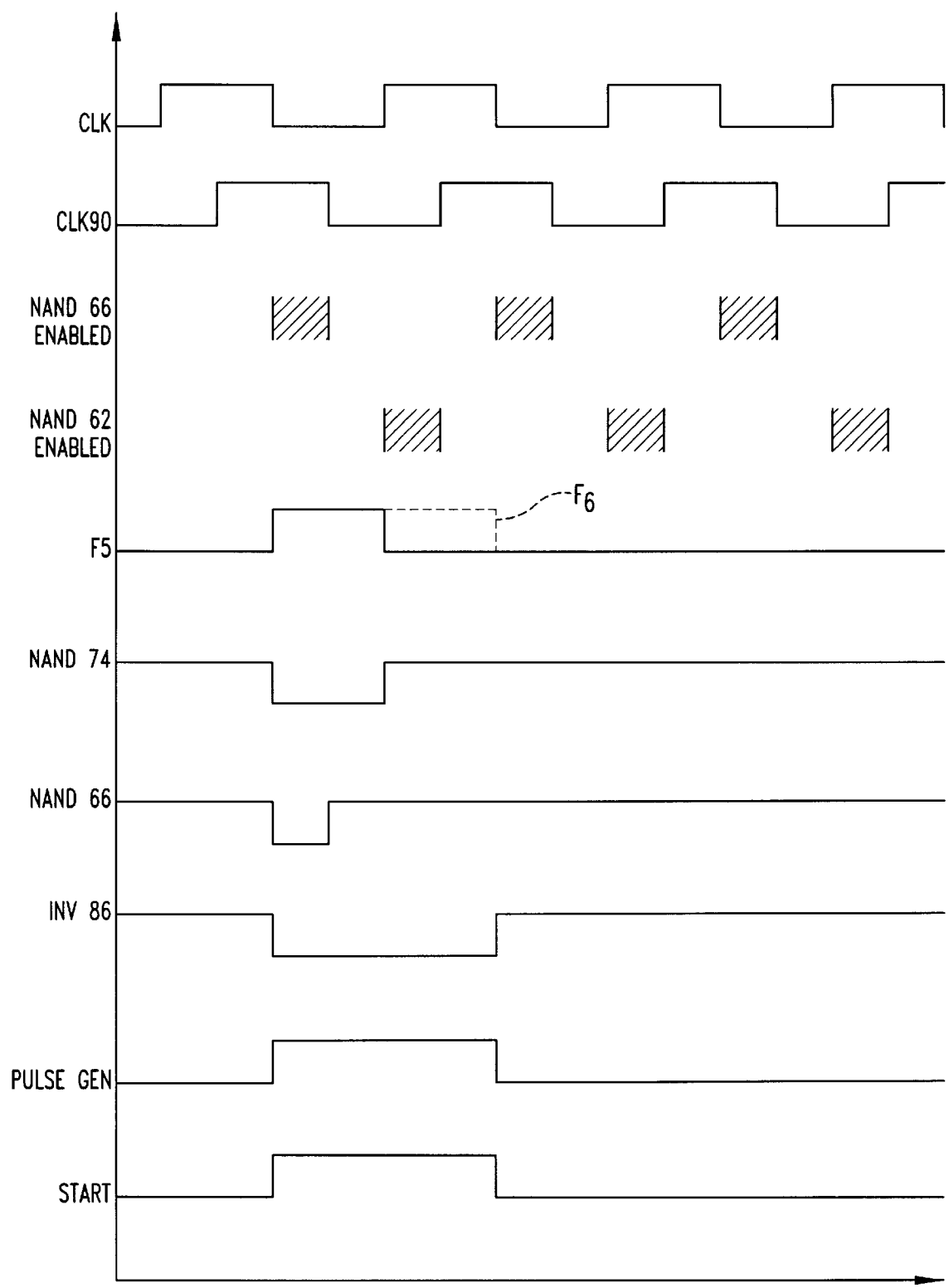
FIG. 7 is a timing diagram showing various signals present in the counter start logic of FIG. 6.

The Counter Start Logic circuit 40 is shown in greater detail in FIG. 6 and explained with reference to the timing diagram of FIG. 7. The Counter Start Logic circuit 40 receives the CLK and CLK 90 signals, which are shown in the upper portion of FIG. 7. As shown in FIG. 7, the CLK 90 signal leads the CLK signal by 90 degrees. The CLK signal is applied to a NAND gate 62 and, through an inverter 64, to a NAND gate 66. The CLK 90 signal is applied directly to the NAND gate 66 and through an inverter 68 to the NAND gate 62. The NAND gate 66 is enabled by the clock and CLK 90 signals whenever the CLK signal is high and the CLK 90 signal is low. As shown in FIG. 7, the NAND gate 66 is enabled during the periods that are shaded in the third line of the timing diagram of FIG. 7. Thus, the NAND gate 66 is enabled for one-quarter CLK cycle after each falling edge of the CLK signal. As shown in the fourth line of FIG. 7, the NAND gate 62 is enabled whenever the CLK signal is high and the CLK 90 signal is low which occurs for one-quarter clock cycle after each rising edge of the CLIK signal.

The NAND gates 66, 62 each receive as their third input the output of a NAND gate 70 which receives respective outputs from NAND gates 72, 74, and 76. The NAND gate 72 is enabled by the "400" signal from the register 30 whenever the clock speed is 400 MHz. Similarly, the NAND gate 74 is enabled whenever the clock speed is 600 MHz, and the NAND gate 76 is enabled whenever the clock speed is 800 MHz. Additional circuitry may be used to accommodate other clock speed such as clock speeds of 100 MHz, 200 MHz, 300 MHz and 700 MHz. The NAND gate 72 receives the F signal from the $F_4$ stage of the shift register 34, the NAND gate 74 receives the F signal from the $F_5$ output of the shift register 34, and the NAND gate 76 receives the F signal from the $F_6$ stage of the shift register 34. Since only one of the NAND gates 72–76 will be enabled at any one time, only one of the NAND gates 72–76 will pass an F signal generated by the shift register 34. In the example shown in FIG. 7, the "600" output of the register 30 is high thereby enabling the NAND gate 74. Thus, when the $F_5$ signal is generated, the output of the NAND gate 74 goes low, as shown in the sixth line of FIG. 7. In response thereto, the output of the NAND gate 70 goes high for a similar period of time thereby causing the output of the NAND gate 66 to go low as shown in the next line of FIG. 7. Note that the output of the NAND gate 66 goes low for only one-quarter of a clock cycle since the NAND gate 66 is enabled for only that period, as shown in the third line of FIG. 7.

By way of further example, if the "800" SPEED signal from the register 30 is high, the $F_6$ pulse is coupled through the NAND gate 76 and the NAND gate 70. As a result, the NAND gate 70 outputs a pulse shown in phantom in the fifth line of FIG. 7. This pulse causes the output of the NAND gate 62 to go low for one-quarter clock cycle. Thus, the odd F pulses cause the output of the NAND gate 66 to go low at successively later trailing edges of the CLK signal while the even F pulses cause the output of the NAND gate 62 to go low at successively later rising edges of the CLK signal.

The output of the NAND gates 66, 62 are applied to a NAND gate 80 which also receives the output of a negative edge pulse generator 82 through an inverter 84. The output of the NAND gate 80 is coupled to the START terminal of the Counter Start Logic circuit 40 through a pair of inverters 86, 88. The function of the pulse generator 82 and associated circuitry is to ensure at least a minimum duration for the START signal. When the output of either NAND gate 62 or NAND gate 66 goes low, the output of the NAND gate 80 goes high thereby causing the output of the inverter 86 to go low as shown in the eighth line of FIG. 7. When the output of the inverter 86 goes low, it triggers the pulse generator 82.

The pulse generator 82 then outputs a relatively long positive going pulse which is applied through the inverter 84 to the NAND gate 80 as a negative going pulse. The pulse forces the output of the NAND gate 80 high for the duration of the pulse from the pulse generator 82 which, in turn, causes the START signal to remain high for at least the duration of the pulse generated by the pulse generator 82.

Figure 8:
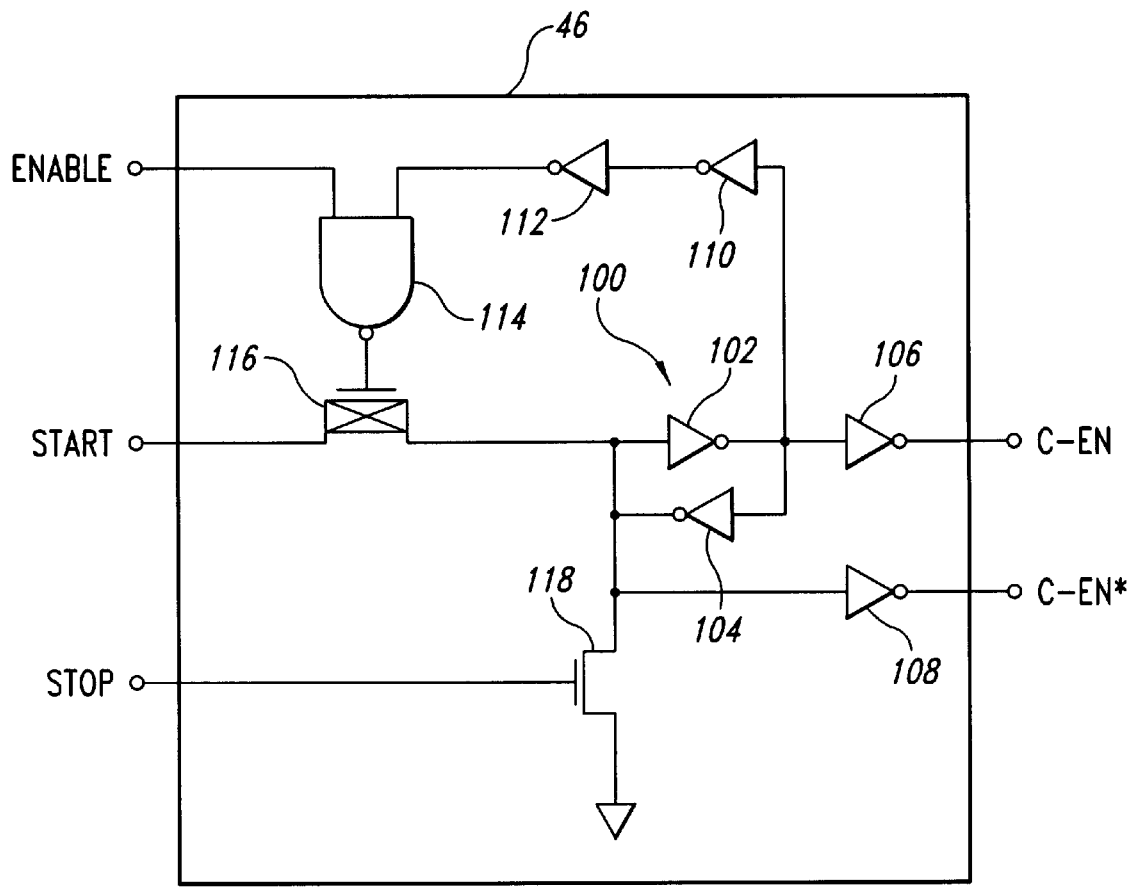
FIG. 8 is a logic diagram and schematic of a counter control circuit used in the preferred embodiment of FIG. 3.

The Counter Control Circuit 46 (FIG. 3) is shown in greater detail in FIG. 8. As explained above, the function of the Counter Control circuit 46 is to selectively enable the Counter 50 responsive to START and STOP signals whenever the counter control circuit 46 is enabled by the ENABLE signal. The Counter Control circuit 46 includes a latch circuit 100 composed of inverters 102, 104. For purposes of explanation, it will be assumed that the initial condition of the latch 100 is such that the output of the inverter 102 is high and the output of the inverter 104 is low. Thus, the high at the output of the inverter 102 causes an inverter 106 to generate an inactive low counter enable signal C-EN, while the low at the output of the inverter 104 causes an inverter 108 to output an inactive high C-EN* signal. The high at the output of the inverter 102 is coupled through inverters 110, 112 to a NAND gate 114. In the event that the ENABLE signal is active high, the NAND gate 114 outputs a low that turns on a PMOS transistor 116. However, prior to the START signal going high, the PMOS transistor 116 remains turned off. When the START signal goes high, it is coupled through the PMOS transistor 116 to switch the latch 100. Thus, the inverter 106 outputs an active high C-EN signal while the inverter 108 outputs an active low C-EN* signal. Shortly after the rising edge of the START signal, the low at the output of the inverter 102 is coupled through the inverters 110, 112 to disable the NAND gate 114 which, in turn, turns off the PMOS transistor 116. However, the C-EN and C-EN* signals are maintained in their active state by the latch 100. When the STOP signal goes high, it turns on an NMOS transistor 118 thereby pulling the inputs to the inverters 102, 108 low. As a result, the inverter 108 once again outputs an inactive high C-EN* signal while the inverter 106 outputs an active low C-EN signal. The low at the input of the inverter 102 also switches the latch 100 to maintain C-EN and C-EN* signals in their inactive states.

As mentioned above, the Counter 50 is preferably an eight stage decrementing quadrature counter which may be conventional and is thus not explained in detail. Similarly, the Load Register 52 may be simply a register containing eight storage cells, each of which stores a respective initial counter value LD CNT. One of these counter values is selected by the SPEED signal and loaded into the Counter 50 by the LOAD signal.

Figure 9:
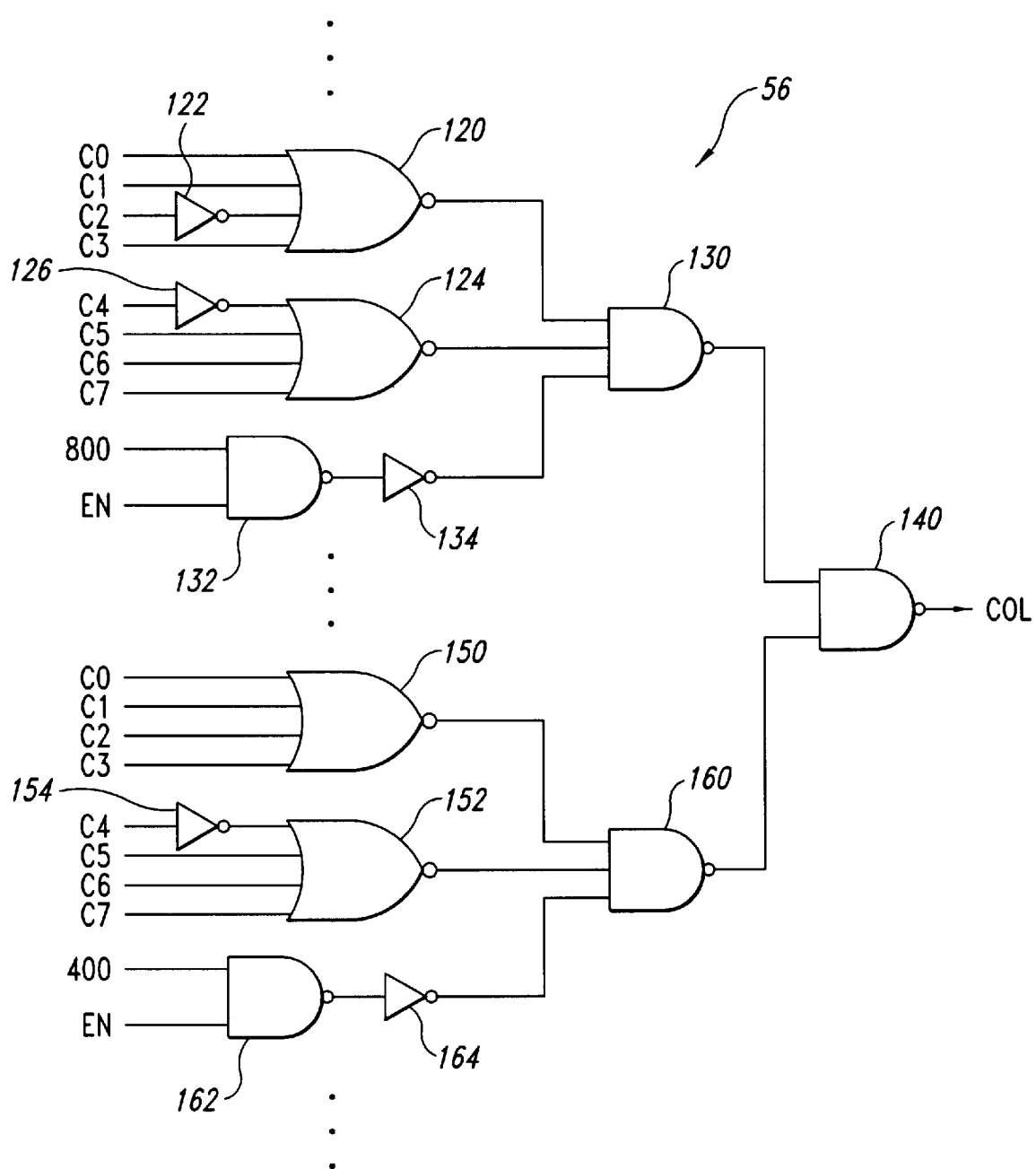
FIG. 9 is a logic diagram showing a portion of a decoder circuit used in the preferred embodiment of FIG. 3.

A portion of the Decoder 56 is illustrated in greater detail in FIG. 9. The portion of the Decoder 56 shown in FIG. 9 is the portion used to generate a COL command signal which causes the DRAM to couple a column address to a memory array. Circuitry for generating the COL command signal is shown for only two different clock speeds, namely 400 MHz and 800 MHz. However, from the portion of the Decoder 56 shown in FIG. 9, the logic circuitry will be apparent for providing the COL signal for other clock speeds and for providing other command signals generated at other counter values. With reference to FIG. 9, the output of the Counter 50 is an 8-bit signal $C_0$–$C_7$. The low order bits are applied to a NOR gate 120 either directly or, in the case of the third bit $C_2$, through an inverter 122. The high order bits are applied to a NOR gate 124 either directly or, in the case of bit $C_4$, through an inverter 126. The NOR gates 120, 124 will each output a high responsive to a counter value of "00101000" which is decimal 20. The outputs of the NOR gates 120, 124 are applied to a NAND gate 130 which is selectively enabled by the output of a NAND gate 132 through an inverter 134. The NAND gate 132 outputs a low to enable the NAND gate 130 whenever the Decoder 56 is enabled by a high EN signal (produced elsewhere in the integrated circuit) and the "800" output from the register 30 is high, designating the clock speed as 800 MHz. Thus, in the event the clock speed is 800 MHz, the output of the NAND gate 130 goes low when the Counter 50 decrements to a counter value of 20. The low at the output of the NAND gate 130 is coupled to a NAND gate 140 which causes the column address enable command signal COL to go high. Thus, when the clock speed is 800 MHz, the COL command signal is generated at a clock value of 20.

The remaining logic circuitry in FIG. 9 operates in substantially the same manner as the previously described circuitry. Specifically, the low order bits from the Counter 50 are applied to a NOR gate 150 while the high order bits from the Counter 50 are applied to a NOR gate 152 either directly or, in the case of bit $C_4$, through an inverter 154. The NOR gates 150, 152 each output a high whenever the Counter 50 outputs a counter value of "11110111" which is decimal 16. The outputs of the NOR gates 150, 152 are applied to a NAND gate 160 which is selectively enabled by the output of a NAND gate 162 coupled to the NAND gate 160 through an inverter 164. The NAND gate 160 is enabled whenever the EN input to the Decoders 56 is high and the register 30 (FIG. 3) outputs a high "400" signal indicative of a clock speed of 400 MHz. Thus, the column address enable command signal COL is generated at a counter value of 16 whenever the clock speed is 400 MHz. In a similar manner, other counter values are decoded to generate other command signals, with the correspondency between command signals and counter values being dependent on the clock speed signal SPEED.

Figure 10:
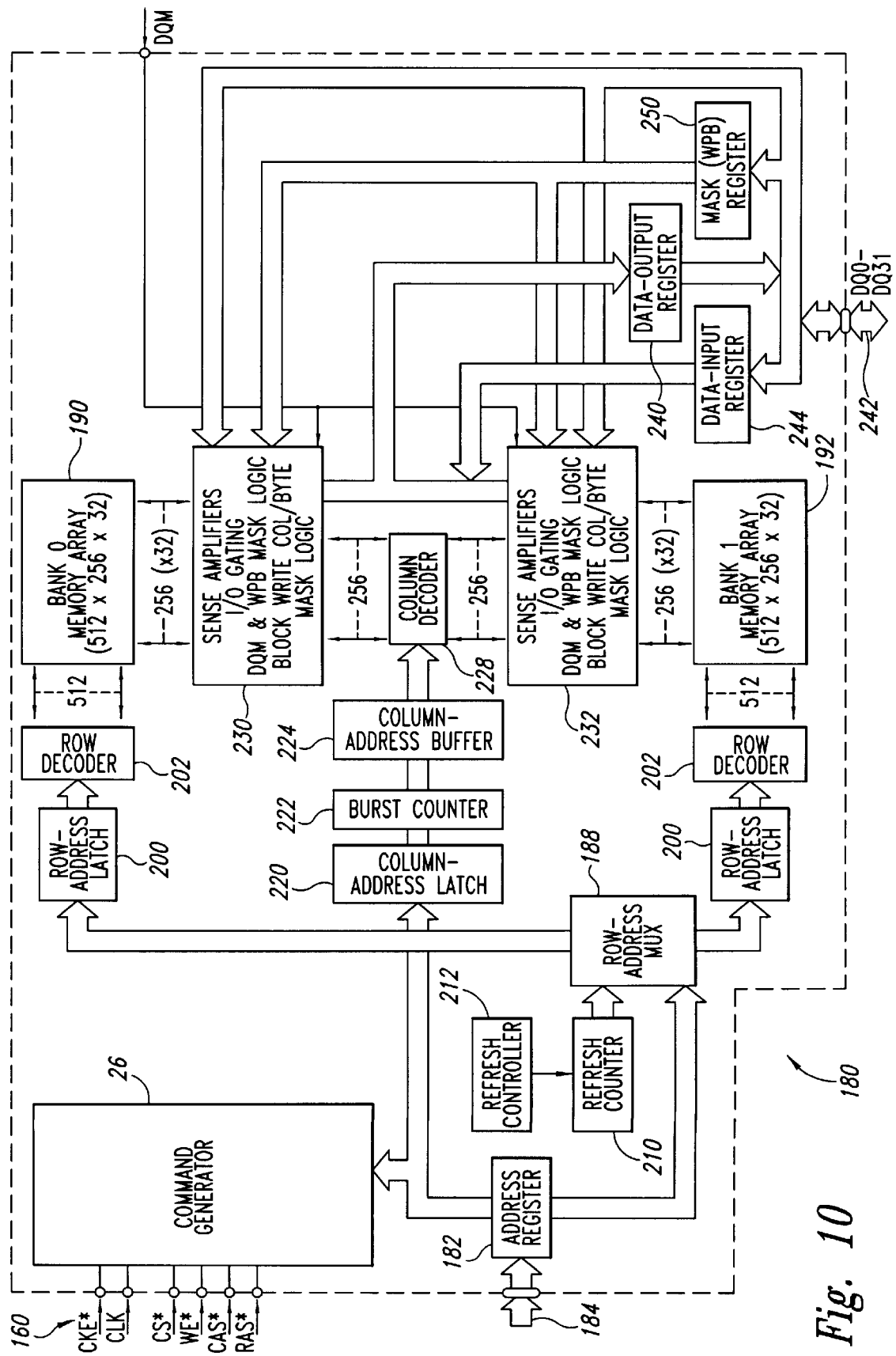
FIG. 10 is a block diagram of a DRAM which includes the command generator of FIG. 3.

A synchronous DRAM ("SDRAM") 180 using the Command Generator 26 of FIG. 3 is shown in FIG. 10. The SDRAM 180 includes an address register 182 that receives either a row address or a column address on an address bus 184. The address bus 184 is generally coupled to a memory controller (not shown in FIG. 10). A row address is initially received by the address register 182 and applied to a row address multiplexer 188. The row address multiplexer 188 couples the row address to a number of components associated with either of two memory banks 190, 192 depending upon the state of a bank address bit BA forming part of the row address. Associated with each of the memory banks 190, 192 are a respective row address latch 200 which stores the row address, and a row decoder 202 which applies various row signals to its respective array 190 or 192 as a function of the stored row address. The row address multiplexer 188 also couples row addresses to the row address latches 200 for the purpose of refreshing the memory cells in the arrays 190, 192. The row addresses are generated for refresh purposes by a refresh counter 210 which is controlled by a refresh controller 212.

After the row address has been applied to the address register 182 and stored in one of the row address latches 200, a column address is applied to the address register 182. The address register 182 couples the column address to a column address latch 220. Depending on the operating mode of the SDRAM 180, the column address is either coupled through a burst counter 222 to a column address register 224 or to the burst counter 222 which applies a sequence of column addresses to the column address buffer 224 starting at the column address output by the address register 182. In either case, the column address buffer 224 applies a column address to a column decoder 228 which applies various column signals to respective sense amplifiers and associated circuitry 230, 232 for the respective arrays 190, 192.

The column circuitry 230, 232 receive data from the arrays 190, 192, respectively, and couple the data to a data output register 240 which applies the data to a data bus 242. Data to be written to one of the arrays 190, 192 is coupled from the data bus 242 through a data input register 244 to the column circuitry 230, 232 where it is transferred to one of the arrays 190, 192, respectively. A mask register 250 may be used to selectively alter the flow of data into and out of the column circuitry 230, 232 such as by selectively masking data to be read from the arrays 190, 192.

The above-described operation of the SDRAM 180 is controlled by the Command Generator 26 responsive to high level command signals received on a control bus 160. These high level command signals, which are typically generated by a memory controller (not shown in FIG. 10), are a clock enable signal CKE*, a clock signal CLK, a chip select signal CS*, a write enable signal WE*, a row address strobe signal RAS*, and a column address strobe signal CAS*, which the "*" designating the signal as active low. However, other high level command signals may be used. In either case, the Command Generator 26 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these control signals will be omitted.

Although the Command Generator 26 has been described as generating command signals for an SDRAM, it will be understood that a sequence of command signals for other varieties of DRAMs, as well as other integrated circuit devices, may be generated in a similar manner.

Figure 11:
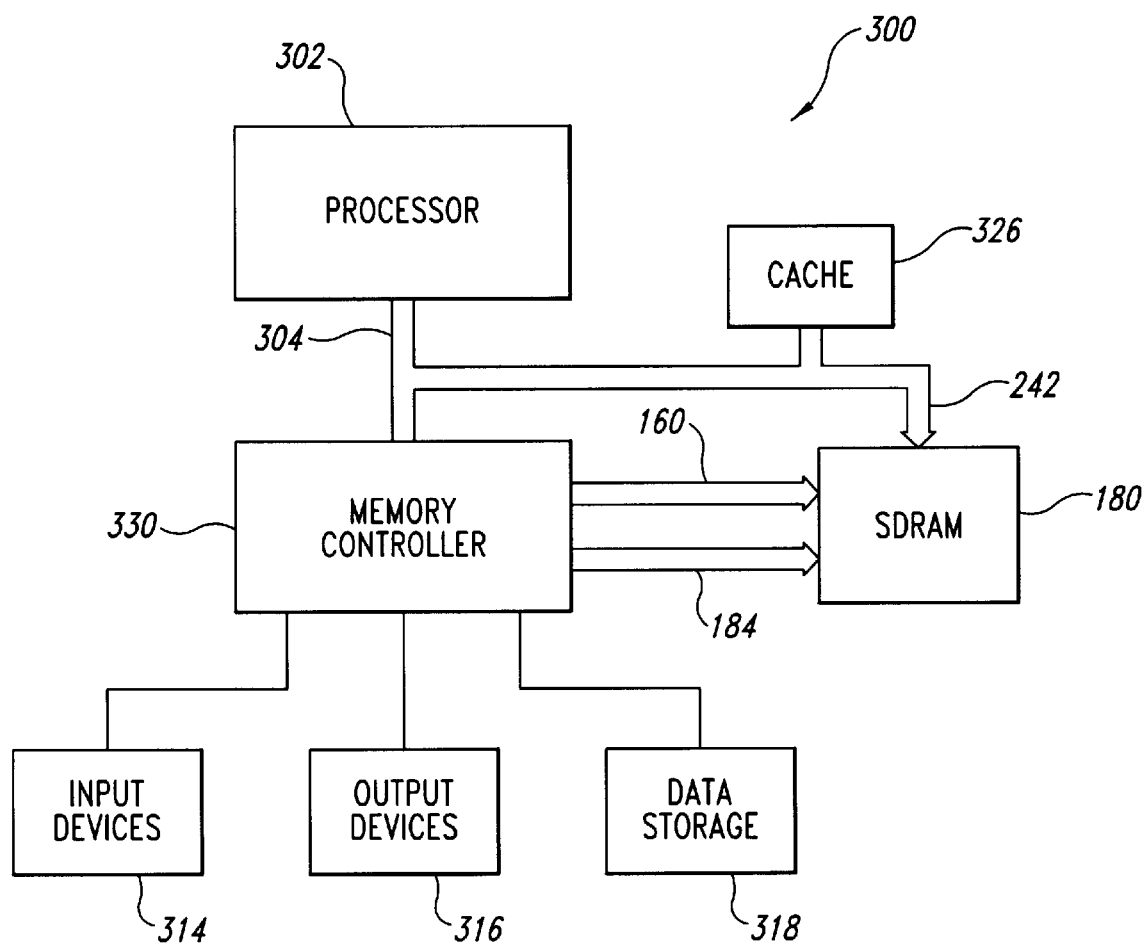
FIG. 11 is a block diagram of a computer system which includes the DRAM of FIG. 10.

FIG. 11 is a block diagram of a computer system 300 which includes the SDRAM 180 of FIG. 10. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to store data or retrieve data from external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM") and to the SDRAM 180 through a memory controller 330. The memory controller 330 normally includes the control bus 160 and the address bus 184 that is coupled to the SDRAM 180. The data bus 242 may be coupled to the processor bus 304 either directly (as shown), through the memory controller 330, or by some other means.

What is claimed is:

1. A command generator for generating command signals for a memory device, the command generator comprising:

a counter receiving a clock signal having at least one of a plurality of speeds, the counter generating a counter value that increments or decrements responsive to file clock signal;

a clock speed indicator providing a clock speed signal corresponding to the speed of the clock signal; and a decoder coupled to the counter and the clock speed indicator, the decoder generating one of a plurality of sequences of command signals for the memory device, the command signals in each sequence corresponding to respective counter values, each of the sequences of command signals corresponding to a respective clock speed, the decoder selecting one of a plurality of the sequences responsive to the clock speed signal.

2. The command generator of claim 1 wherein the sequences of command signals corresponding to different clock speeds are different from each other.

3. The command generator of claim 2 wherein at least some of the corresponding command signals in different sequences of command signals are generated responsive to different counter values.

4. The command generator of claim 1, further comprising a counter load circuit coupled to the counter and the clock speed indicator, the counter load circuit loading an initial count into the counter from which the counter increments or decrements responsive to the clock signal, the value of the initial count being a function of the clock speed signal.

5. The command generator of claim 4 wherein the initial count loaded into the counter is a greater number of counts away from a terminal count for higher clock speeds.

6. The command generator of claim 1 wherein the clock speed indicator comprises a register storing a plurality of clock speed values, one of the clock speed values being selectable to provide the clock speed signal corresponding thereto.

7. The command generator of claim 1, further comprising a counter enable circuit generating a counter enable signal to permit the counter to increment or decrement responsive to the clock signal, comprising:

a latch circuit generating the enable signal responsive to a start signal and terminating the enable signal responsive to a stop signal; and a counter start circuit comprising a clock detector detecting predetermined portions of the clock signal, and a variable delay enable circuit coupled to the clock detector and the clock speed indicator, the variable delay enable circuit selecting one of the detected predetermined portions of the clock signal subsequent to a flag signal after a predetermined number of cycles of the clock signal, the predetermined number of clock cycles corresponding to the clock speed signal, the variable delay enable circuit generating the start signal responsive to the detected predetermined portion of the clock signal selected by the variable delay enable circuit.

8. The command generator of claim 7, further comprising a pulse duration control circuit for controlling the minimum duration of the start signal, the pulse duration control circuit comprising:

a pulse generator coupled to the variable delay enable circuit, the pulse generator generating a pulse having a predetermined delay responsive to the detected predetermined portion of the clock signal selected by the variable delay enable circuit; and a logic circuit coupled to the pulse generator, the logic circuit generating the start signal responsive to either the pulse generated by the pulse generator or the detected predetermined portion of the clock signal selected by the variable delay enable circuit.

9. A command generator for generating command signals for a memory device, the command generator comprising:
   a clock speed indicator providing a clock speed signal corresponding to the speed of a clock signal having at least one of a plurality of clock speeds; and
   a sequencer coupled to the clock speed indicator and generating a sequence of command signals for the memory device responsive to the clock signal, the timing of the command signals in the sequence being determined by the clock speed signal whereby the timing and nature of the command signals correspond to the clock speed.

10. The command generator of claim 9 wherein the sequencer comprises:
   a counter receiving the clock signal and generating a counter value that increments or decrements responsive to the clock signal; and
   a decoder coupled to the counter and the clock speed indicator, the decoder generating one of a plurality of sequences of command signals for the memory device, the command signals in each sequence corresponding to respective counter values, each of the sequences of command signals corresponding to a respective clock speed, the decoder selecting one of a plurality of the sequences responsive to the clock speed signal.

11. The command generator of claim 10 wherein at least some of the corresponding command signals in different sequences of command signals are generated responsive to different counter values.

12. The command generator of claim 10, further comprising a counter load circuit coupled to the counter and the clock speed indicator, the counter load circuit loading an initial count into the counter from which the counter increments or decrements responsive to the clock signal, the value of the initial count being a function of the clock speed signal.

13. A command generator for generating command signals for a memory device, the command generator comprising:
   a counter receiving a clock signal having at least one of a plurality of speeds, the counter generating a counter value that increments or decrements responsive to the clock signal; and
   a decoder coupled to the counter, the decoder generating one of a plurality of sequences of command signals for the memory device with each of the command signals in each sequence being generated at a time corresponding to a respective counter value, the decoder selecting one of a plurality of the sequences responsive to a clock speed signal indicative of the clock speed.

14. The command generator of claim 13, further comprising a clock speed indicator providing the clock speed signal corresponding to the speed of the clock signal.

15. The command generator of claim 14 wherein the clock speed indicator comprises a register storing a plurality of clock speed values, one of the clock speed values being selectable to provide the clock speed values being selectable to provide the clock speed signal corresponding thereto.

16. The command generator of claim 13 wherein the sequences of command signals corresponding to different clock speeds are different from each other.

17. The command generator of claim 16 wherein at least some of the corresponding command signals in different sequences of command signals are generated responsive to different counter values.

18. The command generator of claim 13, further comprising a counter load circuit loading an initial count into the counter from which the counter increments or decrements responsive to the clock signal, the value of the initial count being a function of the speed of the clock signal.

19. The command generator of claim 18, wherein the initial count loaded into the counter is a greater number of counts away from a terminal count for higher clock speeds.

20. The command generator of claim 14, further comprising a counter enable circuit generating a counter enable signal to permit the counter to increment or decrement responsive to the clock signal, comprising:
   a latch circuit generating the enable signal responsive to a start signal and terminating the enable signal responsive to a stop signal; and
   a counter start circuit comprising a clock detector detecting predetermined portions of the clock signal, and a variable delay enable circuit coupled to the clock detector and the clock speed indicator, the variable delay enable circuit selecting one of the detected predetermined portions of the clock signal subsequent to a flag signal after a predetermined number of cycles of the clock signal, the predetermined number of clock cycles corresponding to the clock speed signal, the variable delay enable circuit generating the start signal responsive to the detected predetermined portion of the clock signal selected by the variable delay enable circuit.

21. The command generator of claim 20, further comprising a pulse duration control circuit for controlling the minimum duration of the start signal, the pulse duration control circuit comprising:
   a pulse generator coupled to the variable delay enable circuit, the pulse generator generating a pulse having a predetermined delay responsive to the detected predetermined portion of the clock signal selected by the variable delay enable circuit; and
   a logic circuit coupled to the pulse generator, the logic circuit generating the start signal responsive to either the pulse generated by the pulse generator or the detected predetermined portion of the clock signal selected by the variable delay enable circuit.

22. A command generator for generating command signals for a memory device, the command generator comprising:
   a counter receiving a clock signal having at least one of a plurality of clock speeds, the counter generating a counter value that increments or decrements responsive to the clock signal; and
   a decoder coupled to the counter, the decoder generating a sequence of command signals for the memory device each of which corresponds to a respective counter value, the correspondency between each command signal and its respective counter value being a function of the clock speed.

23. The command generator of claim 22, further comprising a clock speed indicator providing the clock speed signal corresponding to the speed of the clock signal.

24. The command generator of claim 23 wherein the clock speed indicator comprises a register storing a plurality of clock speed values, one of the clock speed values being selectable to provide the clock speed signal corresponding thereto.

25. The command generator of claim 22 wherein the sequences of command signals corresponding to different clock speeds are different from each other.

26. The command generator of claim 25 wherein at least some of the corresponding command signals in different sequences of command signals are generated responsive to different counter values.

27. The command generator of claim 22, further comprising a counter load circuit loading an initial count into the counter from which the counter increments or decrements responsive to the clock signal, the value of the initial count being a function of the speed of the clock signal.

28. The command generator of claim 27 wherein the initial count loaded into the counter is a greater number of counts away from a terminal count for higher clock speeds.

29. The command generator of claim 23, further comprising a counter enable circuit generating a counter enable signal to permit the counter to increment or decrement responsive to the clock signal, comprising:

a latch circuit generating the enable signal responsive to a start signal and terminating the enable signal responsive to a stop signal; and a counter start circuit comprising a clock detector detecting predetermined portions of the clock signal, and a variable delay enable circuit coupled to the clock detector and the clock speed indicator, the variable delay enable circuit selecting one of the detected predetermined portions of the clock signal subsequent to a flag signal after a predetermined number of cycles of the clock signal, the predetermined number of clock cycles corresponding to the clock speed signal, the variable delay enable circuit generating the start signal responsive to the detected predetermined portion of the clock signal selected by the variable delay enable circuit.

30. The command generator of claim 29, further comprising a pulse duration control circuit for controlling the minimum duration of the start signal, the pulse duration control circuit comprising:

a pulse generator coupled to the variable delay enable circuit, the pulse generator generating a pulse having a predetermined delay responsive to the detected predetermined portion of the clock signal selected by the variable delay enable circuit; and a logic circuit coupled to the pulse generator, the logic circuit generating the start signal responsive to either the pulse generated by the pulse generator or the detected predetermined portion of the clock signal selected by the variable delay enable circuit.

31. A dynamic random access memory, comprising:

a clock circuit generating a clock signal that may have one of a plurality of speeds;

a clock speed indicator providing a clock speed signal corresponding to the speed of the clock signal;

at least one array of memory cells storing data at a location determined by a row address and a column address;

a row address circuit receiving and decoding the row address, and selecting a row of memory cells corresponding to the row address responsive to a first set of command signals;

a column address circuit applying or receiving data to one of the memory cells in the selected row corresponding to the column address responsive to a second set of command signals;

a data path circuit coupling data between an external terminal and the column address circuit responsive to a third set of command signals; and a command signal generator coupled to the clock speed indicator and generating a sequence of command signals responsive to the clock signal, including the first, second and third set of command signals, the timing of the command signals in the sequence being determined by the clock speed signal.

32. The dynamic random access memory of claim 31 wherein the command signal generator comprises:

a counter receiving the clock signal and generating a counter value that increments or decrements responsive to the clock signal; and a decoder coupled to the counter and the clock speed indicator, the decoder generating one of a plurality of sequences of command signals for the memory device, the command signals in each sequence corresponding to respective counter values, each of the sequences of command signals corresponding to a respective clock speed, the decoder selecting one of a plurality of the sequences responsive to the clock speed signal.

33. The dynamic random access memory of claim 32 wherein at least some of the corresponding command signals in different sequences of command signals are generated responsive to different counter values.

34. The dynamic random access memory of claim 32, further comprising a counter load circuit coupled to the counter and the clock speed indicator, the counter load circuit loading an initial count into the counter from which the counter increments or decrements responsive to the clock signal, the value of the initial count being a function of the clock speed signal.

35. A dynamic random access memory, comprising:

a clock circuit generating a clock signal having at least one of a plurality of speeds;

at least one array of memory cells storing data at a location determined by a row address and a column address;

a row address circuit receiving and decoding the row address, and selecting a row of memory cells corresponding to the row address responsive to a first set of command signals;

a column address circuit receiving or applying data to one of the memory cells in the selected row corresponding to the column address responsive to a second set of command signals;

a data path circuit coupling data between an external terminal and the column address circuit responsive to a third set of command signals;

a counter receiving a clock signal, the counter generating a counter value that increments or decrements responsive to the clock signal; and a command generator coupled to the counter, the command generator generating the first, second, and third sets of command signals, each command signal corresponding to a respective counter value, the command generator generating one of a plurality of sequences of command signals, including the first, second, and third set of command signals, each of the sequences of command signals corresponding to a respective clock speed, the command generator selecting one of a plurality of the sequences responsive to a clock speed signal indicative of the clock speed.

36. The dynamic random access memory of claim 35, further comprising a clock speed indicator providing the clock speed signal corresponding to the speed of the clock signal.

37. The dynamic random access memory of claim 36 wherein the clock speed indicator comprises a register storing a plurality of clock speed values, one of the clock speed values being selectable to provide the clock speed signal corresponding thereto.

38. The dynamic random access memory of claim 35 wherein the sequences of command signals corresponding to different clock speeds are different from each other.

39. The dynamic random access memory of claim 38 wherein at least some of the corresponding command signals in different sequences of command signals are generated responsive to different counter values.

40. The dynamic random access memory of claim 35, further comprising a counter load circuit loading an initial count into the counter from which the counter increments or decrements responsive to the clock signal, the value of the initial count being a function of the speed of the clock signal.

41. The dynamic random access memory of claim 40 wherein the initial count loaded into the counter is a greater number of counts away from a terminal count for higher clock speeds.

42. The dynamic random access memory of claim 35, further comprising a counter enable circuit generating a counter enable signal to permit the counter to increment or decrement responsive to the clock signal, comprising:
   a latch circuit generating the enable signal responsive to a start signal and terminating the enable signal responsive to a stop signal; and
   a counter start circuit comprising a clock detector detecting predetermined portions of the clock signal, and a variable delay enable circuit coupled to the clock detector and the clock speed indicator, the variable delay enable circuit selecting one of the detected predetermined portions of the clock signal subsequent to a flag signal after a predetermined number of cycles of the clock signal, the predetermined number of clock cycles corresponding to the clock speed signal, the variable delay enable circuit generating the start signal responsive to the detected predetermined portion of the clock signal selected by the variable delay enable circuit.

43. The dynamic random access memory of claim 42, further comprising a pulse duration control circuit for controlling the minimum duration of the start signal, the pulse duration control circuit comprising:
   a pulse generator coupled to the variable delay enable circuit, the pulse generator generating a pulse having a predetermined delay responsive to the detected predetermined portion of the clock signal selected by the variable delay enable circuit; and
   a logic circuit coupled to the pulse generator, the logic circuit generating the start signal responsive to either the pulse generated by the pulse generator or the detected predetermined portion of the clock signal selected by the variable delay enable circuit.

44. The dynamic random access memory of claim 35 wherein the correspondency between each command signal and its respective counter value is a function of the clock speed.

45. A computer system, comprising:
   a processor having a processor bus;
   an input device coupled to the processor through the processor bus allowing data to be entered into the computer system;
   an output device coupled to the processor through the processor bus allowing data to be output from the computer system; and
   a dynamic random access memory coupled to the processor bus allowing data to be stored, the dynamic random access memory comprising:
      a clock circuit generating a clock signal having at least one of a plurality of speeds;
      at least one array of memory cells storing data at a location determined by a row address and a column address;
      a row address circuit receiving and decoding the row address, and select a row of memory cells corresponding to the row address responsive to a first set of command signals;
      a column address circuit receiving or applying data to one of the memory cells in the selected row corresponding to the column address responsive to a second set of command signals;
      a data path circuit coupling data between an external terminal and the column address circuit responsive to a third set of command signals;
      a counter receiving a clock signal, the counter generating a counter value that increments or decrements responsive to the clock signal; and
      a command generator coupled to the counter, the command generator generating the first, second, and third set of command signals, each of the command signals being generated at a time corresponding to a respective counter value, the command generator generating one of a plurality of sequences of command signals, including the first, second, and third set of command signals, each of the sequences of command signals corresponding to a respective clock speed, the command generator selecting one of a plurality of the sequences responsive to a clock speed signal indicative of the clock speed.

46. The computer system of claim 45, further comprising a clock speed indicator providing the clock speed signal corresponding to the speed of the clock signal.

47. The computer system of claim 46 wherein the clock speed indicator comprises a register storing a plurality of clock speed values, one of the clock speed values being selectable to provide the clock speed signal corresponding thereto.

48. The computer system of claim 46, further comprising a counter enable circuit generating a counter enable signal to permit the counter to increment or decrement responsive to the clock signal, comprising:
   a latch circuit generating the enable signal responsive to a start signal and terminating the enable signal responsive to a stop signal; and
   a counter start circuit comprising a clock detector detecting predetermined portions of the clock signal, and a variable delay enable circuit coupled to the clock detector and the clock speed indicator, the variable delay enable circuit selecting one of the detected predetermined portions of the clock signal subsequent to a flag signal after a predetermined number of cycles of the clock signal, the predetermined number of clock cycles corresponding to the clock speed signal, the variable delay enable circuit generating the start signal responsive to the detected predetermined portion of the clock signal selected by the variable delay enable circuit.

49. The computer system of claim 48, further comprising a pulse duration control circuit for controlling the minimum duration of the start signal, the pulse duration control circuit comprising:
   a pulse generator coupled to the variable delay enable circuit, the pulse generator generating a pulse having a predetermined delay responsive to the detected predetermined portion of the clock signal selected by the variable delay enable circuit; and a logic circuit coupled to the pulse generator, the logic circuit generating the start signal responsive to either the pulse generated by the pulse generator or the detected predetermined portion of the clock signal selected by the variable delay enable circuit.

50. The computer system of claim 45 wherein the sequences of command signals corresponding to different clock speeds are different from each other.

51. The computer system of claim 50 wherein at least some of the corresponding command signals in different sequences of command signals are generated responsive to different counter values.

52. The computer system of claim 45, further comprising a counter load circuit loading an initial count into the counter from which the counter increments or decrements responsive to the clock signal, the value of the initial count being a function of the speed of the clock signal.

53. The computer system of claim 52 wherein the initial count loaded into the counter is a greater number of counts away from a terminal count for higher clock speeds.

54. A computer system, comprising:
   a processor having a processor bus;
   an input device coupled to the processor through the processor bus and allowing data to be entered into the computer system;
   an output device coupled to the processor through the processor bus allowing data to be output from the computer system; and
   a dynamic random access memory coupled to the processor bus allowing data to be stored, the dynamic random access memory comprising:
      a clock circuit generating a clock signal that may have one of a plurality of speeds;
      a clock speed indicator providing a clock speed signal corresponding to the speed of the clock signal;
      at least one array of memory cells storing data at a location determined by a row address and a column address;
      a row address circuit receiving and decoding the row address, and select a row of memory cells corresponding to the row address responsive to a first set of command signals;
      a column address circuit receiving or applying data to one of the memory cells in the selected row corresponding to the column address responsive to a second set of command signals;
      a data path circuit coupling data between an external terminal and the column address circuit responsive to a third set of command signals; and
      a command signal generator coupled to the clock speed indicator and generating a sequence of command signals responsive to the clock signal, including the first, second and third set of command signals, the timing of the command signals in the sequence being determined by the clock speed signal.

55. The computer system of claim 54 wherein the sequencer comprises:
   a counter receiving the clock signal and generating a counter value that increments or decrements responsive to the clock signal; and
   a decoder coupled to the counter and the clock speed indicator, the decoder generating one of a plurality of sequences of command signals for the memory device, the command signals in each sequence corresponding to respective counter values, each of the sequences of command signals corresponding to a respective clock speed, the decoder selecting one of a plurality of the sequences responsive to the clock speed signal.

56. The computer system of claim 55 wherein at least some of the corresponding command signals in different sequences of command signals are generated responsive to different counter values.

57. The computer system of claim 55, further comprising a counter load circuit coupled to the counter and the clock speed indicator, the counter load circuit loading an initial count into the counter from which the counter increments or decrements responsive to the clock signal, the value of the initial count being a function of the clock speed signal.

58. A method of generating command signals for a memory device responsive to a clock signal, the method comprising generating a sequence of the command signals, the timing of the command signals corresponding to respective numbers of cycles of the clock signal that have occurred during the sequence, the number of clock cycles occurring between at least some of the command signals being determined by the clock signal frequency, the number of clock cycles occurring between command signals being higher for a higher clock signal frequencies and lower for lower clock signal frequencies.

59. The method of claim 58 wherein the timing of the command signals is adjusted so that the number of clock cycles occurring between at least some command signals is inversely proportional to the clock signal frequency whereby time between the command signals is independent of the clock signal frequency.

60. A method of generating command signals for a memory device responsive to a clock signal having at least one of a plurality of speeds, the method comprising:
   providing a plurality of command signal sequences, each sequence using a clock speed having a different respective clock speed, each command having a value;
   selecting one of the command signal sequences as a function of the speed of the clock signal; and
   generating a sequence of command signals from the selected sequence of command signals.

* * * * *

UNITED STATES PATENT AND TRADEMARK OFFICE
CERTIFICATE OF CORRECTION

PATENT NO.      : 6,230,245 B1
DATED           : May 8, 2001
INVENTOR(S)     : Troy A. Manning It is certified that error appears in the above-identified patent and that said Letters Patent is hereby corrected as shown below:

<u>Title page,</u>
Item [56], References Cited, FOREIGN PATENT DOCUMENTS, reads "2 128 383" should read -- 2 128 383 A --

<u>Column 10,</u>
Line 3, reads "file" should read -- the --

Signed and Sealed this

Sixth Day of August, 2002

Attest:

Attesting Officer

JAMES E. ROGAN
*Director of the United States Patent and Trademark Office*